United States Patent
Okita et al.

(10) Patent No.: US 8,525,896 B2
(45) Date of Patent: Sep. 3, 2013

(54) SOLID-STATE IMAGING APPARATUS

(75) Inventors: Akira Okita, Yamato (JP); Masaaki Minowa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 287 days.

(21) Appl. No.: 12/957,797

(22) Filed: Dec. 1, 2010

(65) Prior Publication Data

US 2011/0157398 A1    Jun. 30, 2011

(30) Foreign Application Priority Data

Dec. 25, 2009 (JP) ................................ 2009-295442

(51) Int. Cl.
*H04N 5/232* (2006.01)
*H04N 5/335* (2011.01)

(52) U.S. Cl.
USPC .......................... 348/222.1; 348/300

(58) Field of Classification Search
USPC .............. 348/222.1, 241, 300, 307, 308
See application file for complete search history.

(56) References Cited

U.S. PATENT DOCUMENTS

| | | | |
|---|---|---|---|
| 6,242,728 B1 | 6/2001 | Merrill et al. | 250/208.1 |
| 6,674,470 B1 | 1/2004 | Tanaka et al. | 348/302 |
| 6,784,934 B1 | 8/2004 | Watanabe | 348/308 |
| 7,009,649 B2 | 3/2006 | Watanabe | 348/308 |
| 7,224,390 B2 | 5/2007 | Kokubun et al. | 348/308 |
| 7,321,110 B2 | 1/2008 | Okita et al. | 250/208.1 |
| 7,408,210 B2 | 8/2008 | Ogura et al. | 257/233 |
| 7,456,880 B2 | 11/2008 | Okita et al. | 348/243 |
| 7,460,162 B2 | 12/2008 | Koizumi et al. | 348/294 |
| 7,466,003 B2 | 12/2008 | Ueno et al. | 257/462 |
| 7,514,732 B2 | 4/2009 | Okita et al. | 257/292 |
| 7,538,810 B2 | 5/2009 | Koizumi et al. | 348/308 |
| 7,557,847 B2 | 7/2009 | Okita et al. | 348/308 |
| 7,687,299 B2 | 3/2010 | Ichikawa | 438/57 |
| 7,759,706 B2 | 7/2010 | Itonaga et al. | 257/227 |
| 7,872,286 B2 | 1/2011 | Okita et al. | 257/291 |
| 8,106,983 B2* | 1/2012 | Hirota et al. | 348/308 |
| 8,153,946 B2 | 4/2012 | Toyoshima | 250/208.1 |
| 2003/0141497 A1* | 7/2003 | Watanabe | 257/21 |
| 2004/0090545 A1* | 5/2004 | Shinotsuka et al. | 348/234 |
| 2005/0103975 A1 | 5/2005 | Korthout | 250/208.1 |
| 2008/0273093 A1 | 11/2008 | Okita et al. | 348/220.1 |
| 2009/0033781 A1 | 2/2009 | Okita et al. | 348/308 |

(Continued)

FOREIGN PATENT DOCUMENTS

| | | |
|---|---|---|
| DE | 101 23 819 A1 | 1/2002 |
| JP | 10-150182 A | 6/1998 |
| JP | 2000-244818 A | 9/2000 |
| JP | 2003-234959 A | 8/2003 |

(Continued)

OTHER PUBLICATIONS

Office Action issued by the Japanese Patent Office on May 10, 2013 in counterpart Japanese Appl'n. No. 2009-295442. English Translation of Japanese Office Action, Ref. No. 0077561-01, dated May 14, 2013.

*Primary Examiner* — Trung Diep (74) *Attorney, Agent, or Firm* — Fitzpatrick, Cella, Harper & Scinto (57) ABSTRACT

A solid-state imaging apparatus according to the present invention is characterized in that a reset gate voltage VresH to be applied to a gate of a reset MOS transistor is lower than a power supply voltage SVDD of a power supply to which drains of an amplifying MOS transistor and the reset MOS transistor are connected.

16 Claims, 3 Drawing Sheets

(56) References Cited

U.S. PATENT DOCUMENTS

| | | | |
|---|---|---|---|
| 2009/0218477 A1 | 9/2009 | Okita et al. | 250/24 A |
| 2009/0251582 A1* | 10/2009 | Oike | 348/308 |
| 2010/0007760 A1 | 1/2010 | Suzuki et al. | 348/222.1 |
| 2010/0053396 A1 | 3/2010 | Okita et al. | 348/301 |
| 2010/0182465 A1 | 7/2010 | Okita | 348/273 |

FOREIGN PATENT DOCUMENTS

| | | |
|---|---|---|
| JP | 2005-516401 A | 6/2005 |
| JP | 2005-286168 A | 10/2005 |
| JP | 2006-120679 A | 5/2006 |
| JP | 2009-117613 A | 5/2009 |
| WO | WO 2005/096384 A1 | 10/2005 |

* cited by examiner

SOLID-STATE IMAGING APPARATUS

BACKGROUND OF THE INVENTION

1. Field of the Invention

The present invention relates to a solid-state imaging apparatus and an imaging system.

2. Description of the Related Art

In an APS (active pixel sensor) type solid-state imaging apparatus, an amplifying unit such as a source follower amplifier or the like is provided in each of pixels. Here, a 1/f noise or an RTS (random telegraph signal) noise which arises in a MOS (metal oxide semiconductor) transistor used for the amplifying unit causes noises in the amplifying unit. Here, in Japanese Patent Application Laid-Open No. 2005-286168 discloses, it is effective in reducing such noises that a buried type MOS transistor constitutes the source follower amplifier.

Incidentally, Japanese Patent Application Laid-Open No. 2000-244818 discloses that a source follower amplifier is constituted by a depletion type amplifying MOS transistor, and further discloses that the drain voltage of a reset MOS transistor of which one end is connected to a photoelectric converting unit is set to be lower than the drain voltage of the amplifying MOS transistor. It is said that the reason why such a voltage relationship is established is to have a MOS transistor which is used as a constant current load of a signal line, and operate this transistor in a saturation region.

In order to reduce the 1/f noise or the RTS noise, it is effective to form the channel of the amplifying MOS transistor, which constitutes the source follower amplifier, at a position which is deep from the surface of the semiconductor. However, if the channel is formed at the deep position, a threshold voltage decreases (in a case of an N-channel MOS transistor). As a result, there is a case where the amplifying MOS transistor which constitutes the source follower amplifier operates in a region other than a saturation region. Alternatively, there is a case where the amplifying MOS transistor operates in a transition region between the saturation region and a linear region. Here, if the MOS transistor operates in the linear region, linearity of an output signal from the source follower amplifier deteriorates. In particular, in a case where the amplifying MOS transistor is arranged for each pixel or for plural pixels, there is a possibility that the amplifying MOS transistor which operates in the saturation region and the MOS transistor which operates in the linear region coexist due to a variation of these devices.

In consideration of such a problem as described above, the present invention aims to provide a solid-state imaging apparatus which can secure excellent and satisfactory linearity and also can reduce noises.

SUMMARY OF THE INVENTION

A solid-state imaging apparatus according to the present invention is characterized by an apparatus which has plural pixels each comprising: a photoelectric converting unit configured to perform photoelectric conversion of incident light; an amplifying MOS transistor configured to output a signal based on a charge generated by the photoelectric converting unit; and a reset MOS transistor configured to reset a gate potential of the amplifying MOS transistor, wherein the amplifying MOS transistor is an N-type buried-channel MOS transistor, and a voltage to be applied to a gate of the reset MOS transistor for setting the reset MOS transistor in a conduction state is lower than a voltage to be applied to a drain of the reset MOS transistor.

According to the present invention, it is possible to provide the solid-state imaging apparatus in which linearity is excellent and satisfactory and noises are reduced.

Further features and aspects of the present invention will become apparent from the following detailed description of exemplary embodiments with reference to the attached drawings.

DESCRIPTION OF THE EMBODIMENTS

Hereinafter, exemplary embodiments of the present invention will be described with reference to the attached drawings. In the following description, an example that a pixel is constituted by an N-channel MOS transistor will be explained. However, it should be noted that the present invention is also applicable to a case where the pixel is constituted by a P-channel MOS transistor. In this case, it only has to invert all polarities of voltages.

First Embodiment

Figure 1:
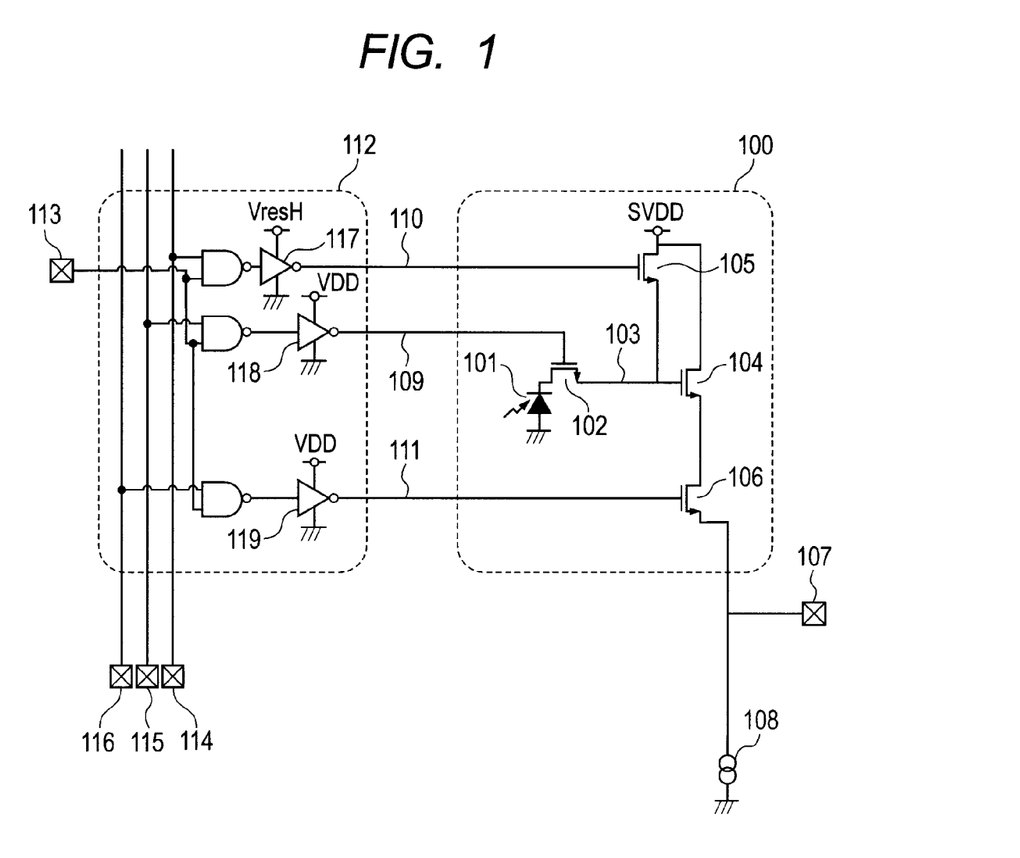
FIG. 1 is a circuit diagram illustrating a pixel to be arranged in a solid-state imaging apparatus according to one embodiment of the present invention.

FIG. 1 is a circuit diagram illustrating a pixel to be arranged in a solid-state imaging apparatus according to the first embodiment of the present invention. In the present embodiment, a pixel 100 includes a photodiode 101, a transfer MOS transistor 102, an FD (floating diffusion) 103, an amplifying MOS transistor 104, a reset MOS transistor 105, and a selection transistor 106.

Here, the photodiode 101 is one example of a photoelectric converting unit. The photoelectric converting unit only has to perform photoelectrical conversion for incident light. The transfer MOS transistor 102 transfers signal charges generated by the photoelectric conversion to the FD 103. The FD 103 is electrically connected to the gate of the amplifying MOS transistor 104. The amplifying MOS transistor 104, which constitutes a part of a source follower amplifier, outputs signals according to an amount of the signal charges transferred to the FD 103. Here, the gate of the amplifying MOS transistor 104 is the input of the source follower amplifier. The reset MOS transistor 105 functions to reset the voltage of the FD 103 to a power supply voltage SVDD. Namely, in the present embodiment, the drain voltages of the amplifying MOS transistor 104 and the reset MOS transistor 105 are equivalent to the common power supply voltage SVDD. The selection transistor 106 selects a row from which signal charges should be output.

The output of the source follower amplifier is connected to a vertical reading line 107, and a constant current source 108 is connected to the vertical reading line 107. Thus, the amplifying MOS transistor 104 and the constant current source 108 together constitute the source follower amplifier.

A transfer MOS transistor driving line 109 is connected to the gate of the transfer MOS transistor 102, a reset MOS transistor driving line 110 is connected to the gate of the reset MOS transistor 105, and a selection transistor driving line 111 is connected to the gate of the selection transistor 106.

Incidentally, the amplifying MOS transistor 104 is a buried-channel MOS transistor. Here, one example of a method of forming the buried-channel MOS transistor will be described. That is, P-type impurities are implanted into the semiconductor region near the interface of a gate insulating layer if necessary. As the P-type impurity, boron or the like can be used. Next, N-type impurities are implanted into the semiconductor region which is below the semiconductor region into which the P-type impurities have been implanted. Here, as the N-type impurity, arsenic or the like can be used. In any case, since the N-type semiconductor region is arranged at a deep position of the substrate as compared with the interface between the substrate and the gate insulating layer, the buried-channel MOS transistor can be established.

In the present embodiment, the reset MOS transistor 105 and the selection transistor 106 may be the buried-channel MOS transistors respectively. In particular, in a case where threshold voltage characteristics of the reset MOS transistor 105 and the selection transistor 106 match with a threshold voltage characteristic of the amplifying MOS transistor 104, a procedure of processes can be simplified. More specifically, in a case where ion implantation is performed to the channel portions of the respective transistors, the ion implantation concerned can be achieved by using a single mask, whereby manufacturing costs can be reduced.

In the present embodiment, the transfer MOS transistor 102 which transfers the signal charges generated by the photoelectric conversion to the FD 103 is included in the pixel. Thus, a predetermined voltage is applied to the gate of the transfer MOS transistor 102 to make the transfer MOS transistor 102 in conduction state, whereby the signal charge in the photodiode 101 is transferred to the FD. More desirably, complete depletion transfer is performed to the charge in the photodiode 101. That is, the constitution for performing the complete depletion transfer to the charge in the photodiode 101 is achieved by providing the transfer MOS transistor 102, whereby occurrence of a leak current in the photodiode 101 can be reduced.

Subsequently, the detail of a driving block 112 will be described. The driving block 112 supplies a signal, which is necessary for an imaging operation, to the pixel. More specifically, a pulse which is transferred from a vertical shift register is input to a terminal 113, and driving pulses are input to terminals 114, 115 and 116 respectively. Then, a logical operation to the pulse from the vertical shift register and the driving pulse is performed by each logical operation circuit which is included in the driving block 112. Subsequently, outputs from the logical operation circuits are input to driving circuits 117, 118 and 119 respectively. Here, the driving circuit 117 supplies the signal to the gate of the reset MOS transistor 105, the driving circuit 118 supplies the signal to the gate of the transfer MOS transistor 102, and the driving circuit 119 supplies the signal to the gate of the selection transistor 106.

Incidentally, a voltage VresH is applied to the gate of the reset MOS transistor 105 in a case where the reset MOS transistor is in a conduction state, and a ground potential VSS is applied to the gate of the reset MOS transistor 105 in a case where the reset MOS transistor is in a non-conduction state. Further, a power supply voltage VDD is applied to the gates of the transfer MOS transistor 102 and the selection transistor 106 in a case where conduction arises in these transistors, and the ground potential VSS is applied to the gates of the transfer MOS transistor 102 and the selection transistor 106 in a case where conduction does not arise in these transistors. In order to suppress a dark current in the photodiode, a negative voltage which is lower than the ground potential may be applied to the gate of the transfer MOS transistor 102 in the case where conduction does not arise in the transfer MOS transistor 102. In the following description, unless otherwise noted, the voltage which is applied to the gate refers the voltage which is applied to the gate of a transistor to make the transistor in a conduction state.

It should be noted that the power supply voltage SVDD of the source follower amplifier is different from the power supply voltage VDD of the driving circuit which supplies the voltage to the gate of each transistor. In general, the power supply voltage VDD is higher than the power supply voltage SVDD. However, the power supply voltage VDD may be the same as the power supply voltage SVDD or less.

The present embodiment is characterized in that the voltage VresH which is applied to the gate of the reset MOS transistor is lower than the power supply voltage SVDD of the power supply. The drain of the amplifying MOS transistor and the drain of the reset MOS transistor are connected to the power supply. Moreover, it is desirable to set the voltage VresH to be lower than the power supply voltage VDD.

Figure 2:
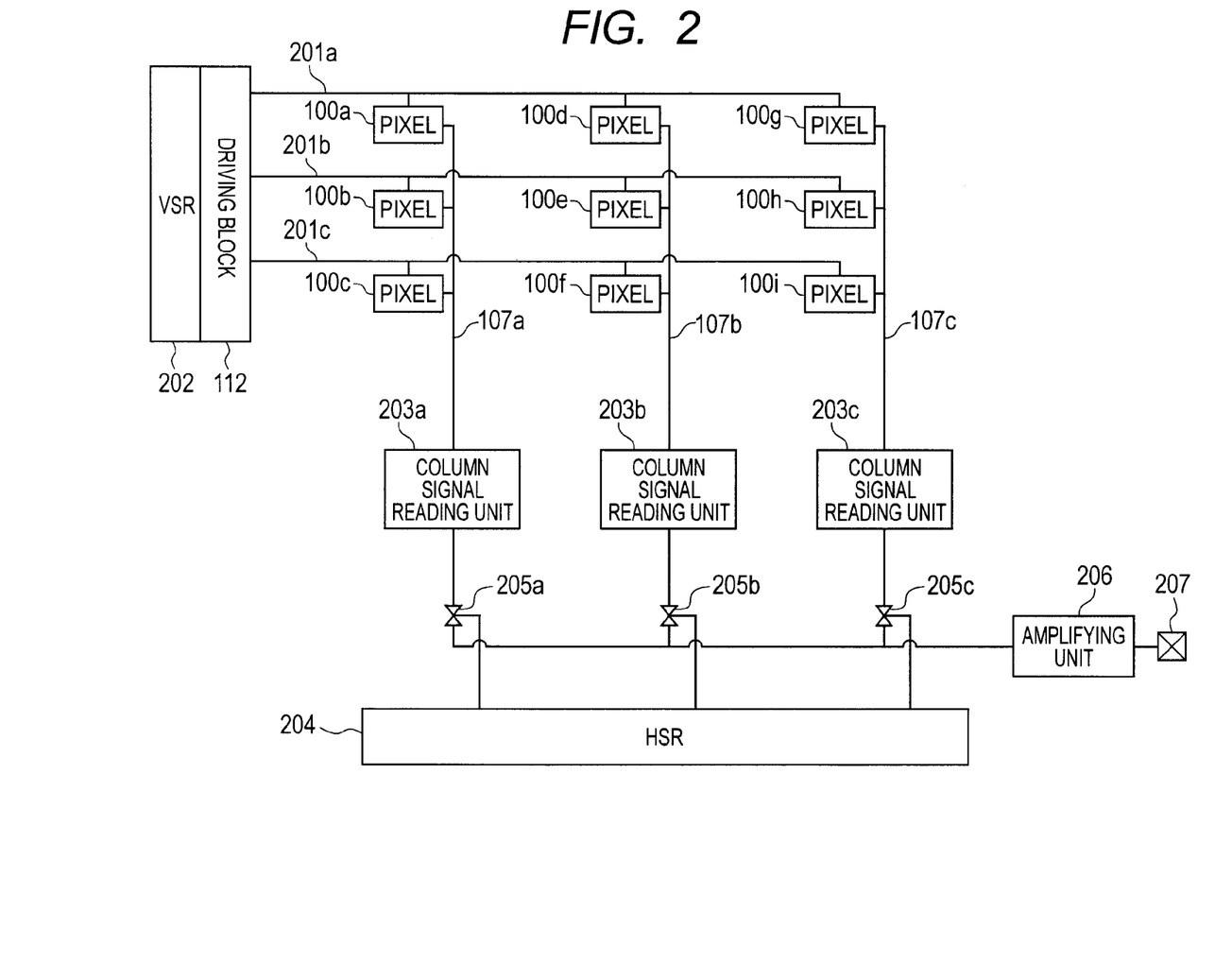
FIG. 2 is a block diagram illustrating the solid-state imaging apparatus according to one embodiment of the present invention.

FIG. 2 is a block diagram illustrating the solid-state imaging apparatus in which the pixel circuit illustrated in FIG. 1 is used. In FIG. 2, each of pixels 100a, 100b, 100c, 100d, 100e, 100f, 100g and 100i is equivalent to the pixel 100 illustrated in FIG. 1. Although FIG. 2 shows an arrangement in which the pixels of 3 rows×3 columns are arranged, the present invention is not limited to this. Namely, plural pixels may be arranged linearly or in matrix in the solid-state imaging apparatus.

In the drawing, vertical reading lines 107a, 107b and 107c are used to output pixel signals respectively obtained from the pixels 100a to 100i, and each of horizontal driving lines 201a, 201b and 201c is used to select the pixels to be read for each row. Here, it should be noted that each of the horizontal driving lines 201a, 201b and 201c is equivalent to the transfer MOS transistor driving line 109, the reset MOS transistor driving line 110 and the selection transistor driving line 111 respectively illustrated in FIG. 1. Further, a VSR (vertical shift register) 202 is connected to the driving block 112. Here, the detailed constitution of the driving block 112 is illustrated in FIG. 1.

Column signal reading units 203a, 203b and 203c are used to process the signals output from the pixels. An HSR (horizontal shift register) 204 generates a control signal to be used to sequentially read the pixel signals held by each of the column signal reading units 203a, 203b and 203c. The pixel signals are sequentially transferred to an amplifying unit 206 by selecting switches 205a, 205b and 205c. Then, the pixel signal is amplified by the amplifying unit 206, and the amplified signal is output from an output terminal 207.

In the present embodiment, the voltage VresH is applied to the gate of the reset MOS transistor 105 in the case where conduction arises in the reset MOS transistor 105. More specifically, the driving circuit 117 which supplies the voltage to the gate of the reset MOS transistor 105 is constituted by an inverter circuit, and the power supply voltage of the inverter circuit concerned is given as VresH. Here, it should be noted that the power supply voltage VresH is lower than the power supply voltage SVDD to be supplied to the drain of the reset MOS transistor 105.

If the voltage to be applied to the gate of the reset MOS transistor 105 is given as VresH, a voltage VGS at the gate of the amplifying MOS transistor 104 is given by the following expression (1). Here, it is assumed that a threshold voltage of the reset MOS transistor 105 is given as Vth_res.

$$VGS = VresH - Vth\_res \quad (1)$$

As indicated by the expression (1), in a case where the voltage to be applied to the gate of the reset MOS transistor 105 decreases, the gate voltage VGS of the amplifying MOS transistor 104 decreases.

The power supply voltage SVDD is applied to the drain of the amplifying MOS transistor 104. Thus, to satisfy a condition that the amplifying MOS transistor 104 operates in a saturation region, it only has to satisfy the following expression (2). Here, it is assumed that a threshold voltage of the amplifying MOS transistor is given as Vth_sf.

$$SVDD \geq VGS - Vth\_sf \quad (2)$$

Therefore, if the gate voltage VGS of the amplifying MOS transistor 104 decreases, the value of the right member of the expression (2) decreases, whereby the operation of the amplifying MOS transistor 104 comes close to the operation in the saturation region.

More desirably, the voltage VresH which is applied to the gate of the reset MOS transistor may satisfy the following expression (3) which is obtained from the expressions (1) and (2).

$$VresH \leq SVDD + Vth\_sf + Vth\_res \quad (3)$$

That is, it is desirable that the voltage VresH is lower than the sum of the drain voltage SVDD of the amplifying MOS transistor, the threshold voltage Vth_sf of the amplifying MOS transistor and the threshold voltage Vth_res of the reset MOS transistor.

Further, to satisfy a condition that conduction arises in the reset MOS transistor 105, it is necessary to satisfy the following expression (4).

$$VresH \geq Vth\_res \quad (4)$$

As just described, since the voltage VresH is lower than the power supply voltage VDD, the amplifying MOS transistor 104 can easily operate in the saturation region. Further, since there is provided the driving circuit which supplies the signals by which the voltages at the time of conduction satisfy the conditions given by the expression (3) and (4), the solid-state imaging apparatus of which the linearity is more excellent and satisfactory can be obtained.

In the present embodiment, the power supply voltage SVDD of the power supply which is connected to the drain of the reset MOS transistor 105 is 4.8V, the voltage VDD which is applied to each of the gates of the transfer MOS transistor 102 and the selection transistor 106 in the case conduction arises in each of these transistors is 5.0V, each of the threshold voltage Vth_sf of the amplifying MOS transistor 104 and the threshold voltage Vth_res of the reset MOS transistor 105 is −0.2V, and the voltage VresH which is applied to the gate of the reset MOS transistor 105 in the case where conduction arises in this transistor is 3.8V.

In a case where a buried-channel MOS transistor is used for the source follower amplifier to reduce a 1/f noise or an RTS noise, the threshold voltage Vth_sf of the amplifying MOS transistor has a value close to 0V or becomes a negative voltage. Further, in a case where a buried-channel MOS transistor is used also for the reset transistor, the threshold voltage Vth_res of the reset MOS transistor likewise has a value close to 0V or becomes a negative voltage. Furthermore, if the buried-channel is formed at the deep position to improve a noise reduction effect, the threshold voltage shifts toward the negative direction. According to this, it is desirable that the voltage VresH is lower.

In the present embodiment, even in a case where the noise is reduced by applying the buried-channel MOS transistor to the amplifying MOS transistor 104 or the like, excellent and satisfactory linearity can be secured by lowering the voltage VresH.

Further, in the present embodiment, the drain voltage of the reset MOS transistor 105 and the drain voltage of the amplifying MOS transistor 104 are common to each other. Namely, the number of wirings can be reduced by connecting the respective drains to the common power supply wiring.

The photodiode 101, the transfer MOS transistor 102, the FD 103, the amplifying MOS transistor 104, the reset MOS transistor 105 and the selection transistor 106 which are included in one pixel are formed on a pixel region of a semiconductor substrate. Further, the pixel regions are arranged linearly or in matrix on the semiconductor substrate. Incidentally, a device separating portion may be arranged between the pixel regions.

The drain of the amplifying MOS transistor 104 and the drain of the reset MOS transistor 105 are connected to the single wiring which is arranged on the pixel region through an insulating film. Thus, a substantial aperture ratio of the photoelectric converting unit can be improved.

Incidentally, in the present embodiment, the drain voltage of the reset MOS transistor 105 may be supplied independently of the drain voltage of the amplifying MOS transistor 104.

Subsequently, a constitution in which the gate potential is higher than or equal to the drain potential when conduction arises in the reset MOS transistor will be described as a comparative example. In such a case, a voltage which is substantially the same as the drain voltage of the reset MOS transistor is supplied to the gate of the amplifying MOS transistor which constitutes the source follower amplifier. If the common power supply voltage SVDD is supplied to the drain of the reset MOS transistor and the drain of the amplifying MOS transistor, SVDD≈VGS is obtained in the expression (2). For this reason, in order to satisfy the condition that the amplifying MOS transistor operates in the saturation region, or in order to satisfy the expression (2), the threshold voltage Vth has to be a positive voltage. For this reason, the buried-channel MOS transistor of which the threshold voltage Vth is negative does not operate in the saturation region. Further, even if the average value of the threshold voltages Vth of the plural pixels is positive, there is a possibility that the threshold voltages Vth of the amplifying MOS transistors of the partial pixels are negative because of a variation of devices due to a manufacturing process and the like. For this reason, linearity cannot be improved by the constitution of the comparative example.

As just described, in the present embodiment, the voltage which is applied to the gate of the reset MOS transistor is lower than the power supply voltage VDD. For this reason, the buried-channel MOS transistor which is used for the source follower amplifier operates easily in the saturation region. Thus, according to the constitution like this, it is possible to reduce noises as improving linearity.

Second Embodiment

Subsequently, the solid-state imaging apparatus according to the second embodiment of the present invention will be described. In the present embodiment, a voltage which is applied to the gate of the reset MOS transistor 105 is not decreased. Instead, a threshold voltage Vth of the reset MOS transistor 105 is increased. More specifically, the power supply of the driving circuit 117 is set to have a power supply voltage VDD, so that the voltage to be applied to the gate of the reset MOS transistor 105 is set to the power supply voltage VDD.

To decrease a gate voltage VGS of the amplifying MOS transistor 104, the threshold voltage Vth of the reset MOS transistor 105 is set to satisfy the following expression (5), which is obtained by substituting the power supply voltage VDD to the voltage VresH in the expression (3).

$$Vth\_res \geq VDD - SVDD - Vth\_sf \quad (5)$$

Here, if it is assumed that the power supply voltage VDD is 5.0V, the power supply voltage SVDD is 4.8V, and the threshold voltage Vth_sf of the amplifying MOS transistor 104 is 0V, then the threshold voltage Vth_res of the reset MOS transistor 105 is equal to or higher than 0.2V. However, in consideration of a variation of characteristics of the MOS transistors and the like, it is desirable to set the threshold voltage Vth_res to be equal to or higher than 0.4V, and it is further desirable to set the threshold voltage Vth_res to be equal to or higher than 0.6V.

In the present embodiment, the threshold value of the reset MOS transistor 105 is the value which satisfies the expression (5). By such a constitution, the buried-channel MOS transistor which is used for the source follower amplifier operates easily in the saturation region. Thus, it is possible to reduce noises as improving linearity.

Third Embodiment

Figure 3:
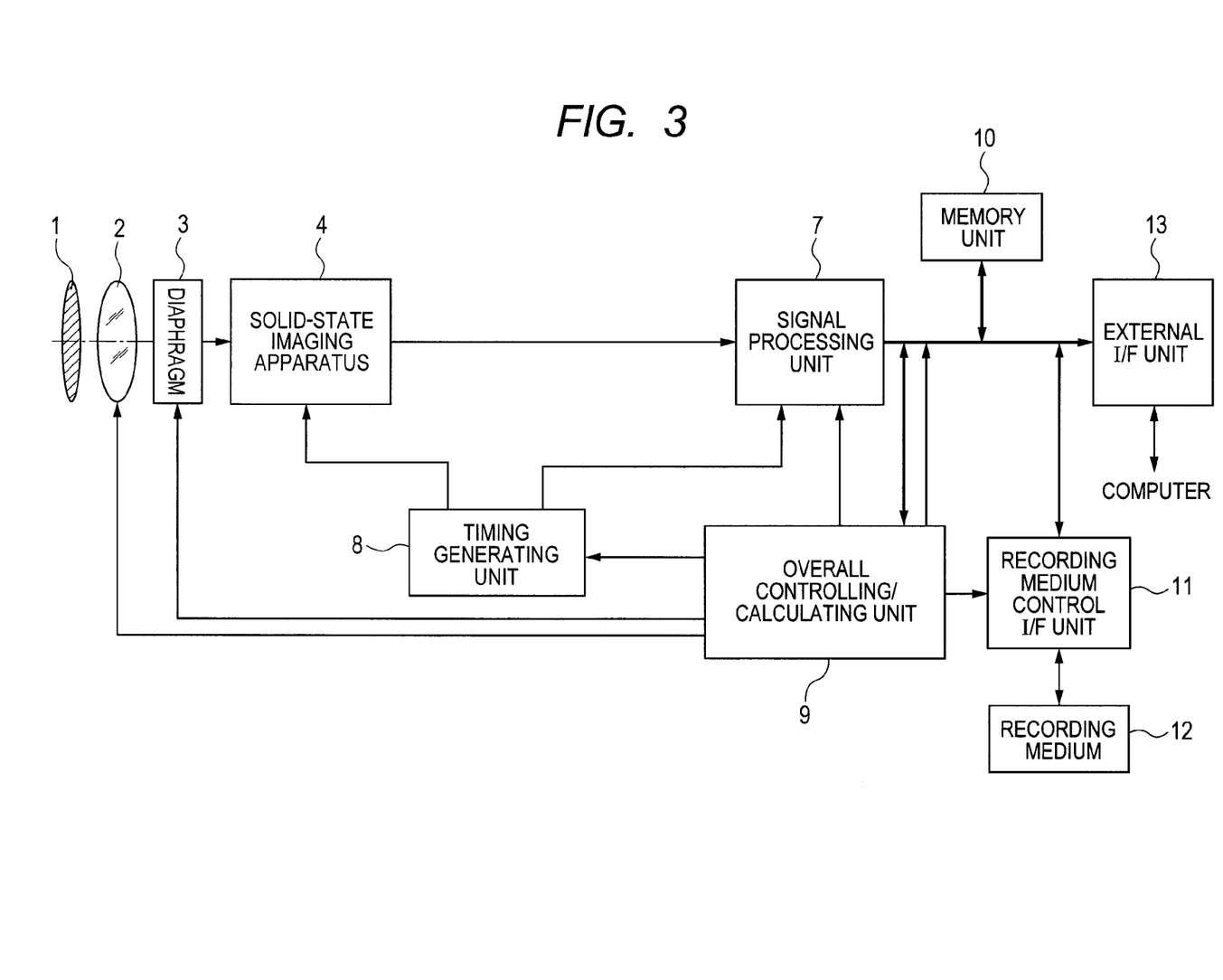
FIG. 3 is a block diagram illustrating an imaging system in which the solid-state imaging apparatus according to the present invention is arranged.

Hereinafter, the third embodiment of the present invention in which the solid-state imaging apparatus according to the present invention is applied to a camera system will be described in detail. Here, it should be noted that, as an imaging system, a digital still camera, a digital camcorder or the like can be used. FIG. 3 is a block diagram illustrating a digital still camera as an example of the imaging system.

In FIG. 3, a barrier 1 is used to protect a lens 2, and the lens 2 provides an optical image of a subject on a solid-state imaging apparatus 4. A diaphragm 3 varies an amount of light which passed through the lens 2, and the solid-state imaging apparatus 4, which has been described in the above embodiments, converts the optical image provided by the lens 2 into image data. Here, an A/D (analog-to-digital) converter is provided on the substrate of the solid-state imaging apparatus 4. A signal processing unit 7 performs various processes such as a correction process, a compression process and the like to the image data output from the solid-state imaging apparatus 4, a timing generation unit 8 generates timing signals to the solid-state imaging apparatus 4 and the signal processing unit 7, an overall controlling/calculating unit 9 which performs various calculations and controls the overall of the digital still camera, a memory unit 10 is used to temporarily store the image data, a recording medium control I/F (interface) unit 11 is used to perform recording or reading to a recording medium 12, the recording medium 12 such as a detachably provided semiconductor memory or the like is used to record and/or read the image data, and an external I/F unit 13 is used to perform communication with an external computer and the like. Here, the timing signal or the like may be input from the outside of the imaging system, and the imaging system only has to provide at least the solid-state imaging apparatus 4 and the signal processing unit 7 for processing the image signal output from the solid-state imaging apparatus 4.

In the present embodiment, the solid-state imaging apparatus 4 and the A/D converter are provided on the same substrate. However, the solid-state imaging apparatus 4 and the A/D converter may be provided respectively on different substrates. Moreover, the solid-state imaging apparatus 4 and the signal processing unit 7 may be provided on the same substrate.

As described above, the solid-state imaging apparatus according to the present invention can be applied to the camera system. That is, if the solid-state imaging apparatus according to the present invention is applied to the camera system, an image in which in which linearity is excellent and satisfactory and noises are reduced can be taken.

In the above description, the pixel is exemplarily constituted by the N-channel MOS transistor. However, the present invention is also applicable to a case where the pixel is constituted by a P-channel MOS transistor. In this case, since the amplifying MOS transistor is constituted by the P-channel MOS transistor, the 1/f noise is reduced as compared with the case where the N-channel MOS transistor is used.

In any case, in the case where the pixel is constituted by the P-channel MOS transistor, it only has to invert all the polarities of the voltages. That is, a ground potential SVSS is applied to the drain of the reset MOS transistor and the drain of the amplifying MOS transistor.

Also, another constitution can be adopted. In this constitution, a power supply voltage SVSS of the power supply to which the drain of the reset MOS transistor and the drain of the amplifying MOS transistor are connected is a negative voltage which is lower than the ground potential. At this time, the voltage VSS which is applied to the gate of each transistor in the case where conduction arises in the transistor concerned is a negative voltage which is lower than the ground potential.

In the case where the pixel is constituted by the P-channel MOS transistor, a voltage which is higher than the voltage to be applied to the drain of the amplifying MOS transistor is applied to the gate of the reset MOS transistor. Moreover, in each of the above-described expressions (1) to (5), the power supply voltage SVDD is replaced by the drain voltage SVSS, and the direction of the inequality sign is inverted. In the case where the amplifying MOS transistor is the P-type buried-channel MOS transistor, the threshold voltage shifts from a negative voltage to a positive voltage.

As a concrete constitution by which the P-channel MOS transistor is applied to the pixel, a constitution in which holes are collected as signal charges is conceivable. In such a case, all the transistors in the pixels can be constituted by the P-channel MOS transistors. As a result, since all the MOS transistors of the pixels can be formed in an N-type well, the pixel can easily be made fine. Besides, the amplifying MOS transistor which is constituted by the P-channel MOS transistor may be arranged in the N-type well by using electrons as the signal charges. In such a case, since the transfer MOS transistor is formed in a P-type well, for example, a back-illuminated constitution in which circuits to be arranged at the stage subsequent to the floating diffusion are formed on a substrate which is different from the photoelectric converting unit is conceived in case of making the pixel fine.

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-295442, filed Dec. 25, 2009, which is hereby incorporated by reference herein in its entirety.

What is claimed is:

1. A solid-state imaging apparatus comprising:
a plurality of pixels, each of the pixels comprising:
a photoelectric converter configured to perform photoelectric conversion of incident light;
an amplifying MOS (metal oxide semiconductor) transistor configured to output a signal based on a charge generated by the photoelectric converter; and
a reset MOS transistor configured to reset potential of a gate of the amplifying MOS transistor to a voltage determined by a voltage of a gate of the reset MOS transistor and a threshold voltage of the reset MOS transistor,
wherein the amplifying MOS transistor is an N-type buried-channel MOS transistor,
the reset MOS transistor is arranged such that a voltage to be applied to the gate of the reset MOS transistor for setting the reset MOS transistor in a conduction state is lower than a voltage to be applied to a drain of the reset MOS transistor, and
a source of the reset MOS transistor is electrically connected to the gate of the amplifying MOS transistor.

2. The solid-state imaging apparatus according to claim 1, wherein each of the pixels is structured such that the voltage (VresH) to be applied to the gate of the reset MOS transistor for setting the reset MOS transistor in the conduction state, a drain voltage (SVDD) of the amplifying MOS transistor, a threshold voltage (Vth_sf) of the amplifying MOS transistor, and the threshold voltage (Vth_res) of the reset MOS transistor satisfy the following two expressions:

$VresH \leq SVDD + Vth\_sf + Vth\_res$, and $VresH \geq Vth\_res$.

3. The solid-state imaging apparatus according to claim 1, wherein the reset MOS transistor is a buried-channel MOS transistor, and the threshold voltage of the reset MOS transistor is a negative voltage.

4. The solid-state imaging apparatus according to claim 1, wherein a threshold voltage of the amplifying MOS transistor is a negative voltage.

5. The solid-state imaging apparatus according to claim 1, wherein each of the pixels further comprises a transfer MOS transistor and a floating diffusion region, and the transfer MOS transistor transfers the charge generated by the photoelectric converter to the floating diffusion region.

6. The solid-state imaging apparatus according to claim 1, wherein a drain of the amplifying MOS transistor and the drain of the reset MOS transistor are connected to a single power supply wiring which is arranged within a pixel region.

7. A solid-state imaging apparatus comprising:
a plurality of pixels, each of the pixels comprising:
a photoelectric converter configured to perform photoelectric conversion of incident light;
an amplifying MOS transistor configured to output a signal based on a charge generated by the photoelectric converter; and
a reset MOS transistor configured to reset potential of a gate of the amplifying MOS transistor to a voltage determined by a voltage of a gate of the reset MOS transistor and a threshold voltage of the reset MOS transistor,
wherein the amplifying MOS transistor is a P-type buried-channel MOS transistor,
the reset MOS transistor is arranged such that a voltage to be applied to the gate of the reset MOS transistor for setting the reset MOS transistor in a conduction state is higher than a voltage to be applied to a drain of the reset MOS transistor, and
a source of the reset MOS transistor is electrically connected to the gate of the amplifying MOS transistor.

8. The solid-state imaging apparatus according to claim 7, wherein each of the pixels is structured such that the voltage (VresH) to be applied to the gate of the reset MOS transistor for setting the reset MOS transistor in the conduction state, a drain voltage (SVSS) of the amplifying MOS transistor, a threshold voltage (Vth_sf) of the amplifying MOS transistor, and the threshold voltage (Vth_res) of the reset MOS transistor satisfy the following two expressions:

$VresH \geq SVSS + Vth\_sf + Vth\_res$, and $VresH \leq Vth\_res$.

9. The solid-state imaging apparatus according to claim 7, wherein the reset MOS transistor is a buried-channel MOS transistor, and the threshold voltage of the reset MOS transistor is a positive voltage.

10. The solid-state imaging apparatus according to claim 7, wherein a threshold voltage of the amplifying MOS transistor is a positive voltage.

11. The solid-state imaging apparatus according to claim 7, wherein each of the pixels further comprises a transfer MOS transistor and a floating diffusion region, and the transfer MOS transistor transfers the charge generated by the photoelectric converter to the floating diffusion region.

12. The solid-state imaging apparatus according to claim 7, wherein a drain of the amplifying MOS transistor and the drain of the reset MOS transistor are connected to a single power supply wiring which is arranged within a pixel region.

13. A solid-state imaging apparatus comprising:
a plurality of pixels, each of the pixels comprising:
a photoelectric converter configured to perform photoelectric conversion of incident light;
an amplifying MOS transistor configured to output a signal based on a charge generated by the photoelectric converter; and
a reset MOS transistor configured to reset a gate potential of the amplifying MOS transistor,
wherein the amplifying MOS transistor is an N-type buried-channel MOS transistor, and the reset MOS transistor is arranged such that a threshold voltage (Vth_res) of the reset MOS transistor, a voltage (VDD) to be applied to a gate of the reset MOS transistor for setting the reset MOS transistor in a conduction state, a voltage (SVDD) to be applied to a drain of the amplifying MOS transistor, and a threshold voltage (Vth_sf) of the amplifying MOS transistor satisfy the following expression:

$Vth\_res \geq VDD - SVDD - Vth\_sf$.

14. A solid-state imaging apparatus comprising:
a plurality of pixels, each of the pixels comprising:
a photoelectric converter configured to perform photoelectric conversion of incident light;
an amplifying MOS transistor configured to output a signal based on a charge generated by the photoelectric converter; and
a reset MOS transistor configured to reset a gate potential of the amplifying MOS transistor,
wherein the amplifying MOS transistor is a P-type buried-channel MOS transistor, and the reset MOS transistor is arranged such that a threshold voltage (Vth_res) of the reset MOS transistor, a voltage (VSS) to be applied to a gate of the reset MOS transistor for setting the reset MOS transistor in a conduction state, a voltage (SVSS) to be applied to a drain of the amplifying MOS transistor, and a threshold voltage (Vth_sf) of the amplifying MOS transistor satisfy the following expression:

$$Vth\_res \leq VSS-SVSS-Vth\_sf.$$

15. An imaging system comprising:
the solid-state imaging apparatus described in claim 1; and
a signal processing unit configured to process an imaging signal output from the solid-state imaging apparatus.

16. An imaging system comprising:
the soid-state imaging apparatus described in claim 7; and
a signal processing unit configured to process an imaging signal output from the solid-state imaging apparatus.

* * * * *